United States Patent
Han

(10) Patent No.: US 10,043,788 B1
(45) Date of Patent: Aug. 7, 2018

(54) MICRO LIGHT EMITTING DIODE DISPLAY PANEL AND REPAIR METHOD THEREOF

(71) Applicant: Shenzhen China Star Optoelectronics Technology Co., Ltd., Shenzhen (CN)

(72) Inventor: Baixiang Han, Shenzhen (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 13 days.

(21) Appl. No.: 15/508,103

(22) PCT Filed: Feb. 15, 2017

(86) PCT No.: PCT/CN2017/073606
§ 371 (c)(1),
(2) Date: Mar. 2, 2017

(51) Int. Cl.
*H01L 21/00* (2006.01)
*H01L 25/16* (2006.01)
*H01L 27/12* (2006.01)
*H01L 33/62* (2010.01)
*H01L 33/48* (2010.01)
*H01L 25/075* (2006.01)
*H01L 21/66* (2006.01)
*H01L 33/44* (2010.01)

(52) U.S. Cl.
CPC ............ *H01L 25/167* (2013.01); *H01L 22/22* (2013.01); *H01L 25/0753* (2013.01); *H01L 27/124* (2013.01); *H01L 27/1248* (2013.01); *H01L 27/1262* (2013.01); *H01L 33/44* (2013.01); *H01L 33/48* (2013.01); *H01L 33/62* (2013.01)

(58) Field of Classification Search
CPC ... H01L 25/167; H01L 27/1248; H01L 33/62; H01L 33/48; H01L 25/0753; H01L 27/124; H01L 22/22; H01L 27/1262; H01L 33/44
See application file for complete search history.

(56) References Cited

U.S. PATENT DOCUMENTS

| 8,791,474 B1 * | 7/2014 | Bibl | G09G 3/2003 257/100 |
| 9,831,228 B2 * | 11/2017 | Yen | H01L 25/50 |
| 9,865,577 B2 * | 1/2018 | Bibl | H01L 25/167 |

* cited by examiner

*Primary Examiner* — Richard Booth
(74) *Attorney, Agent, or Firm* — Leong C. Lei

(57) ABSTRACT

The present invention provides a micro light emitting diode display panel and a repair method thereof. The anode of the micro light emitting diode display panel is divided into a plurality of electrode plates which are spaced with one another. The respective electrode plates are electrically connected and integrated through the connection lines. Each electrode plate is correspondingly arranged with one micro light emitting diode. When one of the micro light emitting diodes is defective, the connection line electrically connected to electrode plate of the micro light emitting diode is cut to individually repair the defective micro light emitting diode to be a dark spot, and other micro light emitting diodes can normally emit light. The present invention can simplify a repair process of the micro light emitting diode display panel to promote the success rate of the repair of the micro light emitting diode display panel.

13 Claims, 8 Drawing Sheets step S1, providing a micro light emitting diode display panel, and micro light emitting diode display panel comprising:
each pixel unit (2) comprising: a TFT layer (21) located on the substrate (1), a planarization layer (22) located on the TFT layer (21), an anode (23) located on the planarization layer (22) and electrically connected to the TFT layer (21), a a pixel definition layer (24) located at peripheral edges of the anode (23) and on the planarization layer (22), a cathode insulation layer (26) located on the anode (23), a plurality of micro light emitting diodes (25) located on the anode (23) and embedded in the cathode insulation layer (26), and a cathode (27) located on the pixel definition layer (24), the cathode insulation layer (26) and the plurality of micro light emitting diodes (25);
the anode (23) comprising an anode voltage level input plate (231) electrically connected to the TFT layer (21), a plurality of electrode plates (232) spaced from the anode voltage level input plate (231) and a plurality of connection lines (233) electrically connected to the electrode plates (232);
an amount of the micro light emitting diodes (25) and an amount of the electrode plates (232) being the same, and one micro light emitting diode (25) being configured on each electrode plate (25);
the anode voltage level input plate (231 being electrically connected to at least two electrode plates (232) through the connection lines (233), and each electrode plate (232) being electrically connected to at least two other electrode plates (232) through the connection lines (233), or being electrically connected to at least one one other electrode plate (232) and the anode voltage level input plate (231); ⟶S1

Step S2, detecting that one of the plurality of micro light emitting diodes (25) is defective, and determining a position of the defective micro light emitting diode (25); ⟶S2 step S3, cutting all of the connection lines (233) electrically connected to the electrode plate (232), in which the micro light emitting diode (25) is defective, and individually repairing the defective micro light emitting diode (25) to be a dark spot. ⟶S3

Fig. 8 ent invention relates to a display technology
MICRO LIGHT EMITTING DIODE DISPLAY PANEL AND REPAIR METHOD THEREOF

FIELD OF THE INVENTION

The present invention relates to a display technology field, and more particularly to a micro light emitting diode display panel and a repair method thereof.

BACKGROUND OF THE INVENTION

The flat panel device possesses advantages of high image quality, power saving, thin body and wide application scope. Thus, it has been widely applied in various consumer electrical products, such as mobile phone, television, personal digital assistant, digital camera, notebook, laptop, and becomes the major display device.

The Micro LED (µLED) display is a kind of display, in which the image display is realized by using a high density, small size LED array integrated on a substrate as a display pixel. Similar with the large size outdoor LED display screen, each pixel can be addressed and individually driven and lighted, the micro LED can be considered as a scaled-down version of the outdoor LED display screen to reduce the pixel dot distance from millimeter level to micron level. The µLED display is a self-luminous display as the same as the organic light emitting diode display. However, the µLED display possesses advantages of better material stability, longer life and no image imprinting in comparison with the OLED display, and is considered to be the biggest competitor of the OLED display.

The Micro Transfer Printing skill is currently the main method of manufacturing the µLED display device. The specific manufacture process is: first, growing micro light emitting diodes on the sapphire substrate, and then employing the Laser lift-off (LLO) to separate the micro light emitting diode bare chip from the sapphire substrate, and then, using a patterned polydimethylsiloxane (PDMS) transfer head to adsorb the micro-emitter bare chip from the sapphire substrate and aligning the PDMS head with the receiving substrate, and then, adhering the micro light emitting diode bare chip adsorbed by the PDMS head on the preset position on the receiving substrate, and then removing the PDMS head to accomplish the transfer of the micro light emitting diode bare chip on the receiving substrate, and thus to manufacture the µLED display device.

Please refer to FIG. 1, which is a sectional diagram of a micro light emitting diode display panel according to prior art. The panel comprises: a substrate 100, a gate 200 located on the substrate 100, a gate insulation layer 300 located on the gate 200 and the substrate 100, an active layer 400 located on the gate insulation layer 300 on the gate 200, an interlayer insulation layer 500 located on the active layer 400 and the gate insulation layer 300, and a source 601 and a drain 602 being spaced on the interlayer insulation layer 500 and contacting with two ends of the active layer 400 respectively, a planarization layer 700 located on the source 601, the drain 602 and the interlayer insulation layer 500, an anode 800 located on the planarization layer 700 and electrically connected with the drain 602, a pixel definition layer 900 located at peripheral edges of the anode 800 and on the planarization layer 700, a cathode insulation layer 1200 located on the anode 800, a plurality of micro light emitting diodes 1000 located on the anode 800 and embedded in the cathode insulation layer 1200, and a cathode 1100 located on the pixel definition layer 900, the cathode insulation layer 1200 and the plurality of micro light emitting diodes 1000.

As shown in FIG. 2, the anode 800 in the micro light emitting diode display panel is as a whole. The plurality of micro light emitting diodes 1000 are aligned on the anode 800 in order. When one micro light emitting diode 100 needs to be repaired, it is necessary to cut off the connection between the anode 800 and the drain 602 for repair. The cutting point is at the position of X in FIG. 2 and FIG. 1. After repair, the other normal micro light emitting diodes 100 cannot emit light, either. The entire pixel becomes a dark spot to result in a waste of resources and to reduce the display quality.

SUMMARY OF THE INVENTION

An objective of the present invention is to provide a micro light emitting diode display panel, which can simplify a repair process of the micro light emitting diode display panel to promote the success rate of the repair of the micro light emitting diode display panel and to ensure the repair result of the micro light emitting diode display panel.

Another objective of the present invention is to provide a repair method of a micro light emitting diode display panel, which can simplify a repair process of the micro light emitting diode display panel to promote the success rate of the repair of the micro light emitting diode display panel and to ensure the repair result of the micro light emitting diode display panel.

For realizing the aforesaid objectives, the present invention provides a micro light emitting diode display panel, comprising: a substrate and a plurality of pixel units aligned in array on the substrate;

each pixel unit comprising: a TFT layer located on the substrate, a planarization layer located on the TFT layer, an anode located on the planarization layer and electrically connected to the TFT layer, a pixel definition layer located at peripheral edges of the anode and on the planarization layer, a cathode insulation layer located on the anode, a plurality of micro light emitting diodes located on the anode and embedded in the cathode insulation layer, and a cathode located on the pixel definition layer, the cathode insulation layer and the plurality of micro light emitting diodes;

the anode comprising an anode voltage level input plate electrically connected to the TFT layer, a plurality of electrode plates spaced from the anode voltage level input plate and a plurality of connection lines electrically connected to the electrode plates;

an amount of the micro light emitting diodes and an amount of the electrode plates being the same, and one micro light emitting diode being configured on each electrode plate;

the anode voltage level input plate being electrically connected to at least two electrode plates through the connection lines, and each electrode plate being electrically connected to at least two other electrode plates through the connection lines, or being electrically connected to at least one other electrode plate and the anode voltage level input plate.

Each pixel unit comprises three micro light emitting diodes and three electrode plates, wherein two electrode plates are electrically connected to the other electrode and the anode voltage level input plate through two connection lines, respectively.

The other electrode plate is further electrically connected to the anode voltage level input plate through one connection line.

The TFT layer comprises: a gate located on the substrate, a gate insulation layer located on the gate and the substrate, an active layer located on the gate insulation layer on the gate, an interlayer insulation layer located on the active layer and the gate insulation layer, and a source and a drain being spaced on the interlayer insulation layer and contacting with two ends of the active layer respectively through a first via and a second via penetrating the interlayer insulation layer.

The anode voltage level input plate contacts with the drain through a third via penetrating the planarization layer.

The present invention further provides a repair method of a micro light emitting diode display panel, comprising steps of:

step S1, providing a micro light emitting diode display panel, and the micro light emitting diode display panel comprising: a substrate and a plurality of pixel units aligned in array on the substrate;

each pixel unit comprising: a TFT layer located on the substrate, a planarization layer located on the TFT layer, an anode located on the planarization layer and electrically connected to the TFT layer, a pixel definition layer located at peripheral edges of the anode and on the planarization layer, a cathode insulation layer located on the anode, a plurality of micro light emitting diodes located on the anode and embedded in the cathode insulation layer, and a cathode located on the pixel definition layer, the cathode insulation layer and the plurality of micro light emitting diodes;

the anode comprising an anode voltage level input plate electrically connected to the TFT layer, a plurality of electrode plates spaced from the anode voltage level input plate and a plurality of connection lines electrically connected to the electrode plates;

an amount of the micro light emitting diodes and an amount of the electrode plates being the same, and one micro light emitting diode being configured on each electrode plate;

the anode voltage level input plate being electrically connected to at least two electrode plates through the connection lines, and each electrode plate being electrically connected to at least two other electrode plates through the connection lines, or being electrically connected to at least one other electrode plate and the anode voltage level input plate;

Step S2, detecting that one of the plurality of micro light emitting diodes is defective, and determining a position of the defective micro light emitting diode;

step S3, cutting all of the connection lines electrically connected to the electrode plate, in which the micro light emitting diode is defective, and individually repairing the defective micro light emitting diode to be a dark spot.

Each pixel unit comprises three micro light emitting diodes and three electrode plates, wherein two electrode plates are electrically connected to the other electrode and the anode voltage level input plate through two connection lines, respectively.

The other electrode plate is further electrically connected to the anode voltage level input plate through one connection line.

The TFT layer comprises: a gate located on the substrate, a gate insulation layer located on the gate and the substrate, an active layer located on the gate insulation layer on the gate, an interlayer insulation layer located on the active layer and the gate insulation layer, and a source and a drain being spaced on the interlayer insulation layer and contacting with two ends of the active layer respectively through a first via and a second via penetrating the interlayer insulation layer.

The anode voltage level input plate contacts with the drain through a third via penetrating the planarization layer.

The present invention further provides a repair method of a micro light emitting diode display panel, comprising steps of:

step S1, providing a micro light emitting diode display panel, and the micro light emitting diode display panel comprising: a substrate and a plurality of pixel units aligned in array on the substrate;

each pixel unit comprising: a TFT layer located on the substrate, a planarization layer located on the TFT layer, an anode located on the planarization layer and electrically connected to the TFT layer, a pixel definition layer located at peripheral edges of the anode and on the planarization layer, a cathode insulation layer located on the anode, a plurality of micro light emitting diodes located on the anode and embedded in the cathode insulation layer, and a cathode located on the pixel definition layer, the cathode insulation layer and the plurality of micro light emitting diodes;

the anode comprising an anode voltage level input plate electrically connected to the TFT layer, a plurality of electrode plates spaced from the anode voltage level input plate and a plurality of connection lines electrically connected to the electrode plates;

an amount of the micro light emitting diodes and an amount of the electrode plates being the same, and one micro light emitting diode being configured on each electrode plate;

the anode voltage level input plate being electrically connected to at least two electrode plates through the connection lines, and each electrode plate being electrically connected to at least two other electrode plates through the connection lines, or being electrically connected to at least one other electrode plate and the anode voltage level input plate;

Step S2, detecting that one of the plurality of micro light emitting diodes is defective, and determining a position of the defective micro light emitting diode;

step S3, cutting all of the connection lines electrically connected to the electrode plate, in which the micro light emitting diode is defective, and individually repairing the defective micro light emitting diode to be a dark spot;

wherein each pixel unit comprises three micro light emitting diodes and three electrode plates, wherein two electrode plates are electrically connected to the other electrode and the anode voltage level input plate through two connection lines, respectively;

wherein the TFT layer comprises: a gate located on the substrate, a gate insulation layer located on the gate and the substrate, an active layer located on the gate insulation layer on the gate, an interlayer insulation layer located on the active layer and the gate insulation layer, and a source and a drain being spaced on the interlayer insulation layer and contacting with two ends of the active layer respectively through a first via and a second via penetrating the interlayer insulation layer.

The benefits of the present invention are: the present invention provides a micro light emitting diode display panel. The anode of the micro light emitting diode display panel is divided into a plurality of electrode plates which are spaced with one another. The respective electrode plates are electrically connected and integrated through the connection lines. Each electrode plate is correspondingly arranged with one micro light emitting diode. When one of the micro light emitting diodes is defective, the connection line electrically connected to electrode plate of the micro light emitting diode is cut to individually repair the defective micro light emitting diode to be a dark spot, and other micro light emitting diodes can normally emit light. The present invention can simplify a repair process of the micro light emitting diode display panel to promote the success rate of the repair of the micro light emitting diode display panel and to ensure the repair result of the micro light emitting diode display panel. The repair method of the micro light emitting diode display panel provided by the present invention can simplify a repair process of the micro light emitting diode display panel to promote the success rate of the repair of the micro light emitting diode display panel and to ensure the repair result of the micro light emitting diode display panel.

BRIEF DESCRIPTION OF THE DRAWINGS

In order to better understand the characteristics and technical aspect of the invention, please refer to the following detailed description of the present invention is concerned with the diagrams, however, provide reference to the accompanying drawings and description only and is not intended to be limiting of the invention.

In drawings,

FIG. 8 is a flowchart of a repair method of a micro light emitting diode display panel according to the present invention.

DETAILED DESCRIPTION OF PREFERRED EMBODIMENTS

For better explaining the technical solution and the effect of the present invention, the present invention will be further described in detail with the accompanying drawings and the specific embodiments.

Figure 1:
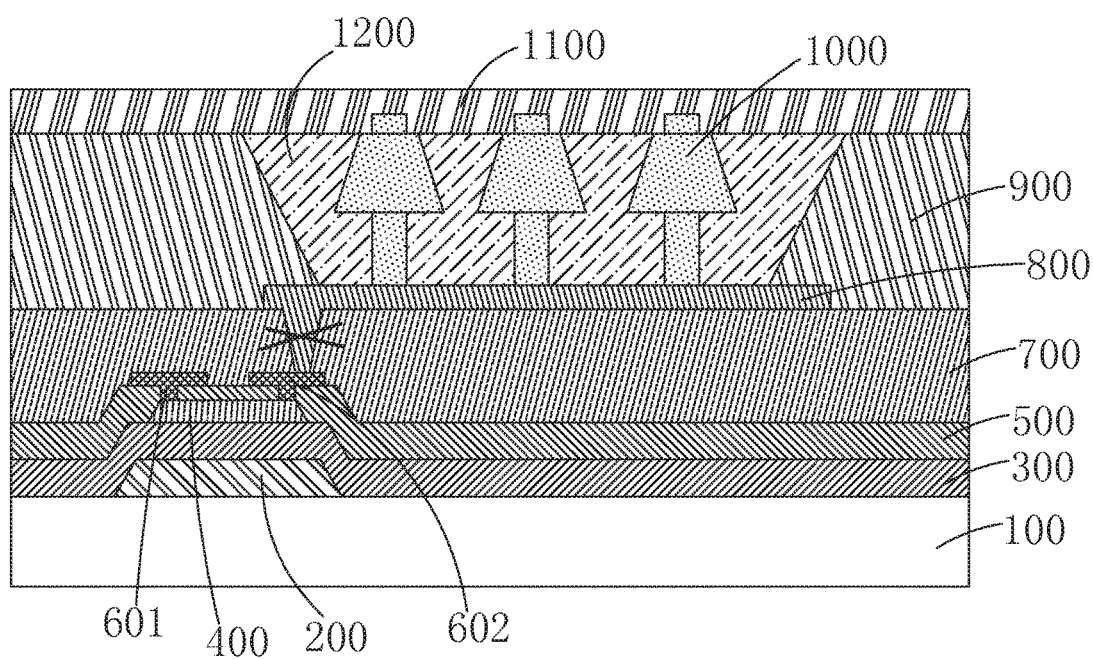
FIG. 1 is a sectional diagram of a micro light emitting diode display panel according to prior art.
Figure 2:
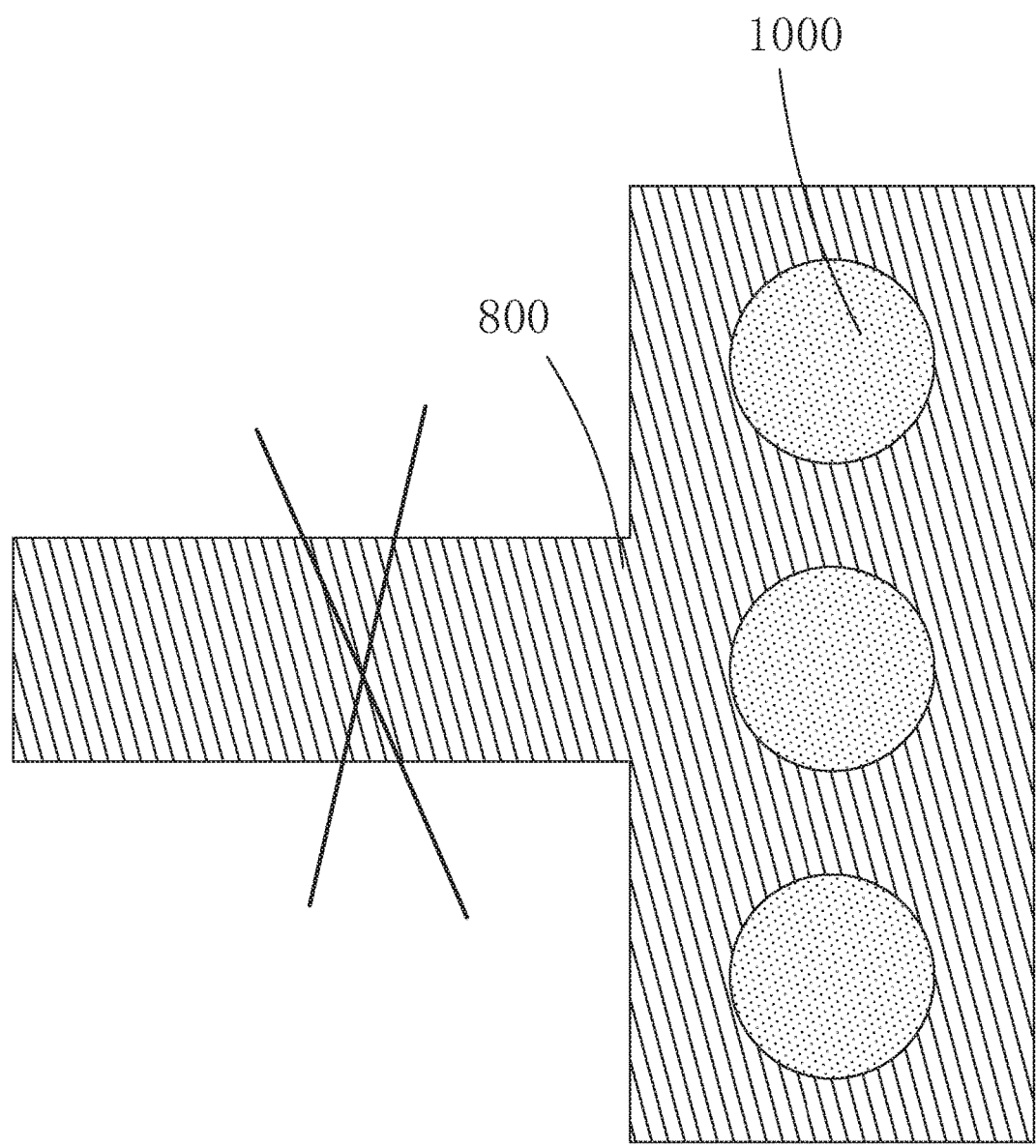
FIG. 2 is a top view diagram of an anode of a micro light emitting diode display panel according to prior art.
Figure 3:
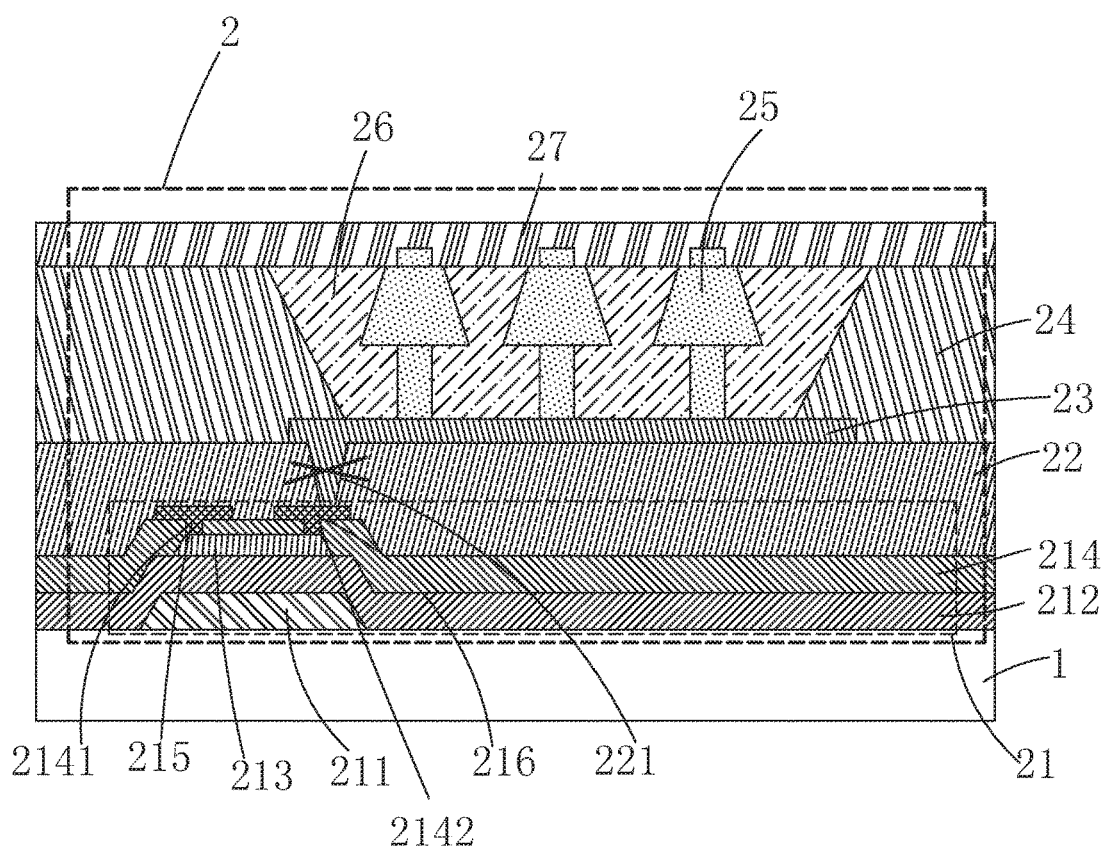
FIG. 3 is a sectional diagram of a micro light emitting diode display panel according to the present invention.

Please refer to FIG. 3. The present invention provides a micro light emitting diode display panel, comprising: a substrate 1 and a plurality of pixel units 2 aligned in array on the substrate 1;

each pixel unit 2 comprising: a TFT layer 21 located on the substrate 1, a planarization layer 22 located on the TFT layer 21, an anode 23 located on the planarization layer 22 and electrically connected to the TFT layer 21, a pixel definition layer 24 located at peripheral edges of the anode 23 and on the planarization layer 22, a cathode insulation layer 26 located on the anode 23, a plurality of micro light emitting diodes 25 located on the anode 23 and embedded in the cathode insulation layer 26, and a cathode 27 located on the pixel definition layer 24, the cathode insulation layer 26 and the plurality of micro light emitting diodes 25;

the anode 23 comprising an anode voltage level input plate 231 electrically connected to the TFT layer 21, a plurality of electrode plates 232 spaced from the anode voltage level input plate 231 and a plurality of connection lines 233 electrically connected to the electrode plates 232;

an amount of the micro light emitting diodes 25 and an amount of the electrode plates 232 being the same, and one micro light emitting diode 25 being configured on each electrode plate 25;

the anode voltage level input plate 231 being electrically connected to at least two electrode plates 232 through the connection lines 233, and each electrode plate 232 being electrically connected to at least two other electrode plates 232 through the connection lines 233, or being electrically connected to at least one other electrode plate 232 and the anode voltage level input plate 231.

Figure 4:
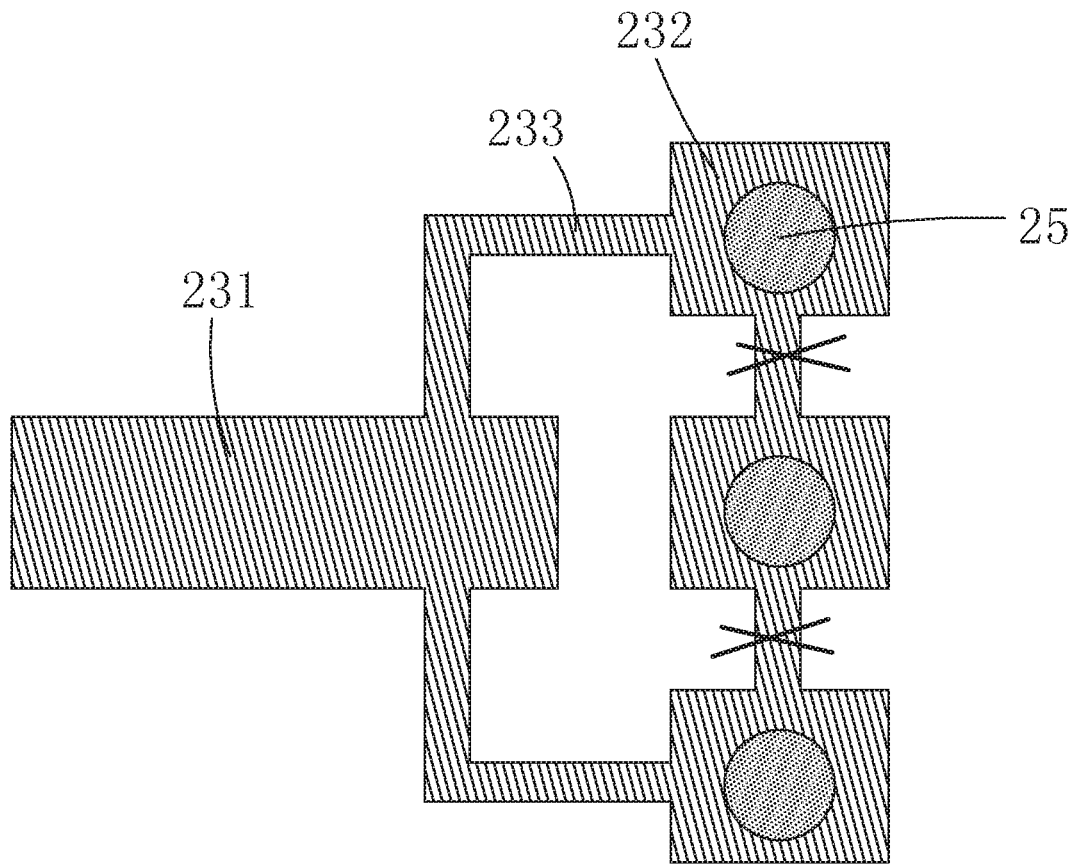
FIG. 4 is a top view diagram of an anode of the first embodiment of a micro light emitting diode display panel according to the present invention.

Specifically, as shown in FIG. 4, in the first embodiment of the present invention, each pixel unit 2 comprises three micro light emitting diodes 25 and three electrode plates 232, wherein two electrode plates 232 are electrically connected to the other electrode 232 and the anode voltage level input plate 231 through two connection lines 233, respectively. When any one of the micro light emitting diodes 25 is defective, the micro light emitting diode 25 can be repaired to be a dark spot as long as cutting the two connection lines 233 electrically connected to electrode plate 232 of the micro light emitting diode 25. The remaining two micro light emitting diodes 25 still can normally acquire the anode voltage level signal from the anode voltage level input plate 231, and normally emit light.

Figure 5:
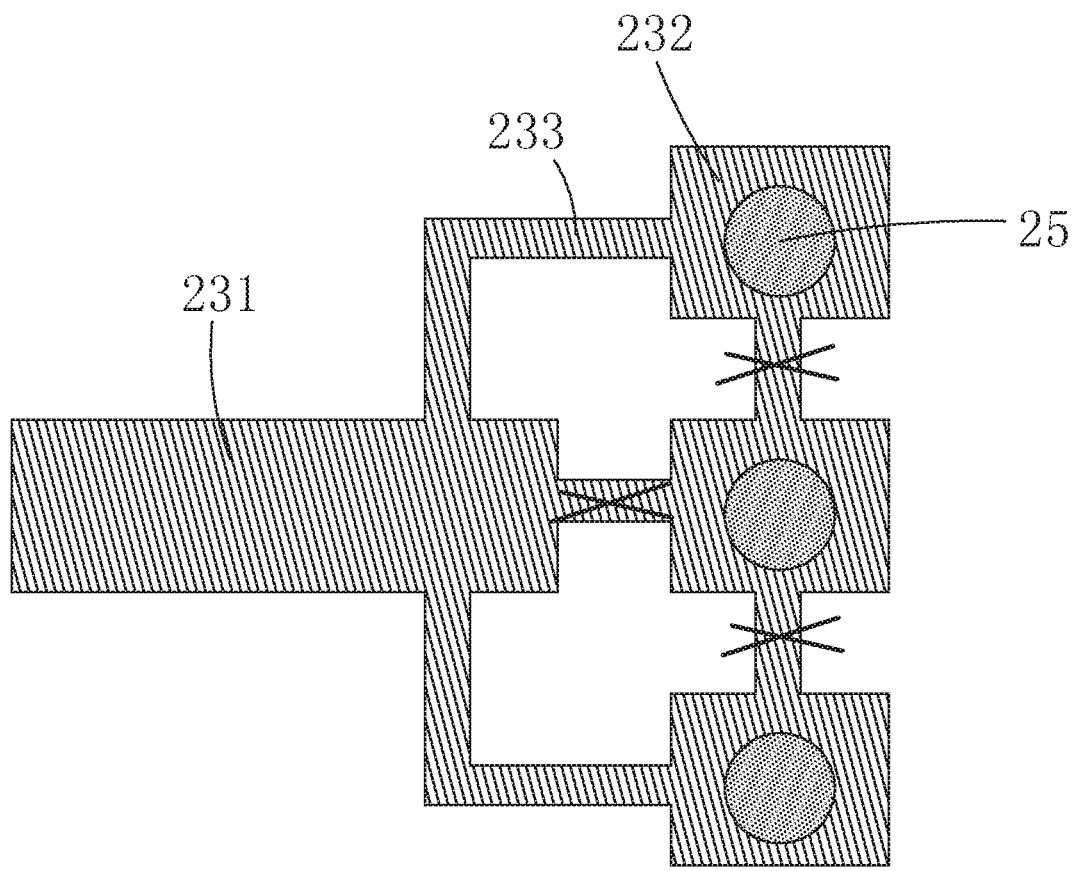
FIG. 5 is a top view diagram of an anode of the second embodiment of a micro light emitting diode display panel according to the present invention.

Specifically, as shown in FIG. 5, FIG. 5 is the second embodiment of the present invention. The difference from the first embodiment is that the other electrode plate 232 is further electrically connected to the anode voltage level input plate 231 through one connection line 233. Namely, all of the three electrode plates 232 are electrically connected to the anode voltage level input plate 231. Then, what is better than the first embodiment is that when any two micro light emitting diodes 25 are defective, it remains to be possible to cut the four connection lines 233 electrically connected to the two electrode plates 232 of the two micro light emitting diodes 25 for repairing the two micro light emitting diodes 25 to be dark spots, and the remaining one micro light emitting diode 25 still can normally acquire the anode voltage level signal from the anode voltage level input plate 231.

Figure 6:
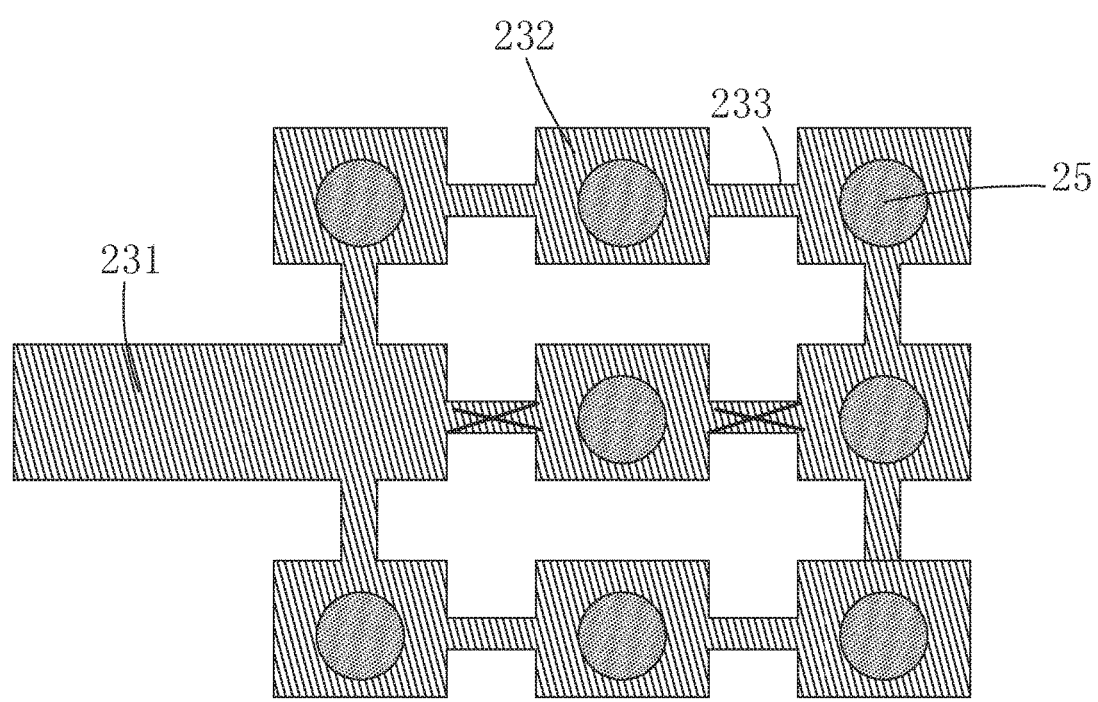
FIG. 6 is a top view diagram of an anode of the third embodiment of a micro light emitting diode display panel according to the present invention.
Figure 7:
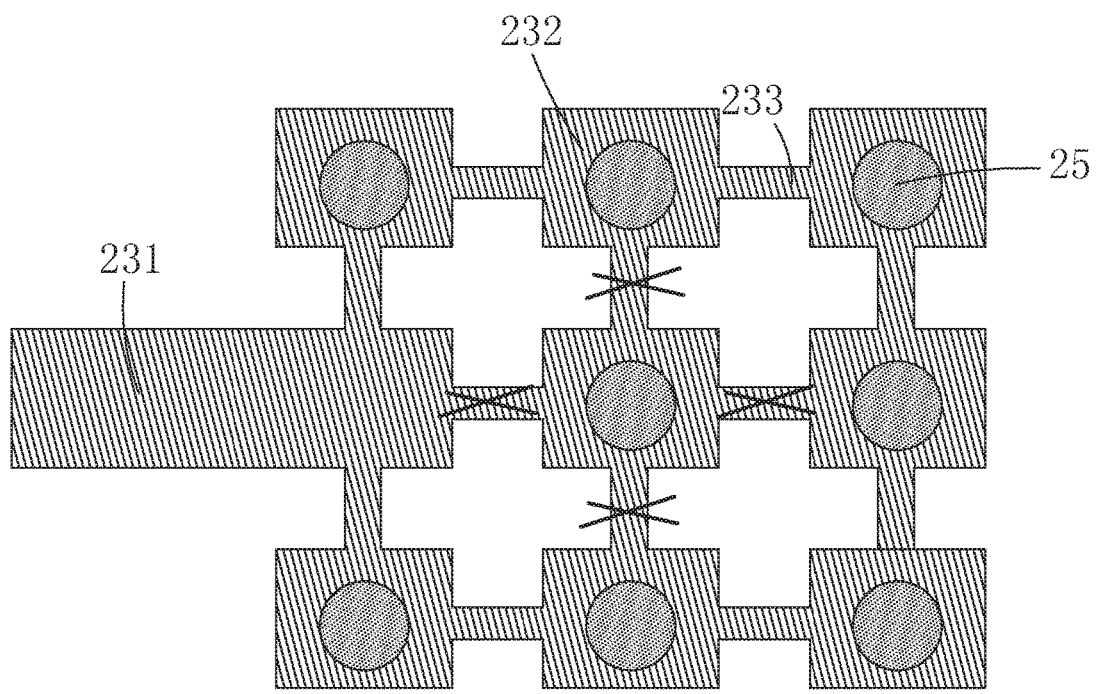
FIG. 7 is a top view diagram of an anode of the fourth embodiment of a micro light emitting diode display panel according to the present invention.

Specifically, as shown in FIG. 6, FIG. 6 is the third embodiment of the present invention. Each pixel unit 2 comprises eight micro light emitting diodes 25 and eight electrode plates 232. The eight micro light emitting diodes 25 and the eight electrode plates 232 are aligned in a matrix of 3 rows and 3 columns. The seven peripheral electrode plates 232 are connected in series with the anode voltage level input plate 231 in order. The electrode plate 232 in the middle are electrically connected to the anode voltage level input plate 231 and one peripheral electrode plate 232 through two connection lines 233, respectively. Besides, FIG. 7 is the fourth embodiment of the present invention. The fourth embodiment is the improvement of the third embodiment. The electrode plate 232 in the middle are electrically connected to the anode voltage level input plate 231 and three peripheral electrode plate 232 through four connection lines 233, respectively. The third embodiment can achieve the individual repair to any one of the micro light emitting diodes 25 without influence the normal light emittance of other micro light emitting diodes 25. The fourth embodiment can achieve the individual repair to any one or two of the micro light emitting diodes 25 without influence the normal light emittance of other micro light emitting diodes 25.

It can be understood that the present invention can further comprises other electrode plate alignments or other connection manners. As long as the anode voltage level input plate 231 are electrically connected to at least two electrode plates 232 through the connection lines 233, and each electrode plate 232 is electrically connected to at least other two electrode plates 232 through the connection lines, or electrically connected to at least one other electrode plate 232 and the anode voltage level input plate 231, the objective of the present invention to individually repair the micro light emitting diode 25 can be achieved, and the achievement of the present invention will not be affected.

Specifically, the TFT layer 21 comprises: a gate 211 located on the substrate 1, a gate insulation layer 212 located on the gate 211 and the substrate 1, an active layer 213 located on the gate insulation layer 212 on the gate 211, an interlayer insulation layer 214 located on the active layer 213 and the gate insulation layer 212, and a source 215 and a drain 216 being spaced on the interlayer insulation layer 214 and contacting with two ends of the active layer 213 respectively through a first via 2141 and a second via 2142 penetrating the interlayer insulation layer 214. The anode voltage level input plate 231 contacts with the drain 216 through a third via 221 penetrating the planarization layer 22.

Please refer to FIG. 8, on the basis of the aforesaid micro light emitting diode display panel, the present invention further provides a repair method of a micro light emitting diode display panel, comprising steps of:

step S1, providing a micro light emitting diode display panel of the present invention. The specific structure is described as aforementioned. The repeated description is omitted here.

Step S2, detecting that one of the plurality of micro light emitting diodes 25 is defective, and determining a position of the defective micro light emitting diode 25.

step S3, cutting all of the connection lines 233 electrically connected to the electrode plate 232, in which the micro light emitting diode 25 is defective, and individually repairing the defective micro light emitting diode 25 to be a dark spot.

Specifically, in step S3, the connection lines 233 are cut by laser cutting process. The specific cutting points can be the positions of X in FIG. 4 to FIG. 7.

Specifically, as shown in FIG. 4, in the first embodiment of the present invention, each pixel unit 2 comprises three micro light emitting diodes 25 and three electrode plates 232, wherein two electrode plates 232 are electrically connected to the other electrode 232 and the anode voltage level input plate 231 through two connection lines 233, respectively. When any one of the micro light emitting diodes 25 is defective, the micro light emitting diode 25 can be repaired to be a dark spot as long as cutting the two connection lines 233 electrically connected to electrode plate 232 of the micro light emitting diode 25. The remaining two micro light emitting diodes 25 still can normally acquire the anode voltage level signal from the anode voltage level input plate 231, and normally emit light. As an illustration in FIG. 4, one micro light emitting diode 25 in the middle is defective. What has to be done is cutting the two connection lines 233 electrically connected to electrode plate 232 of the micro light emitting diode 25. The cutting points can be the positions of X in FIG. 4.

Specifically, as shown in FIG. 5, FIG. 5 is the second embodiment of the present invention. The difference from the first embodiment is that the other electrode plate 232 is further electrically connected to the anode voltage level input plate 231 through one connection line 233. Namely, all of the three electrode plates 232 are electrically connected to the anode voltage level input plate 231. Then, what is better than the first embodiment is that when any two micro light emitting diodes 25 are defective, it remains to be possible to cut the four connection lines 233 electrically connected to the two electrode plates 232 of the two micro light emitting diodes 25 for repairing the two micro light emitting diodes 25 to be dark spots, and the remaining one micro light emitting diode 25 still can normally acquire the anode voltage level signal from the anode voltage level input plate 231. As an illustration in FIG. 5, one micro light emitting diode 25 in the middle is defective. What has to be done is cutting the three connection lines 233 electrically connected to electrode plate 232 of the micro light emitting diode 25. The cutting points can be the positions of X in FIG. 5.

Specifically, as shown in FIG. 6, FIG. 6 is the third embodiment of the present invention. Each pixel unit 2 comprises eight micro light emitting diodes 25 and eight electrode plates 232. The eight micro light emitting diodes 25 and the eight electrode plates 232 are aligned in a matrix of 3 rows and 3 columns. The seven peripheral electrode plates 232 are connected in series with the anode voltage level input plate 231 in order. The electrode plate 232 in the middle are electrically connected to the anode voltage level input plate 231 and one peripheral electrode plate 232 through two connection lines 233, respectively. Besides, FIG. 7 is the fourth embodiment of the present invention. The fourth embodiment is the improvement of the third embodiment. The electrode plate 232 in the middle are electrically connected to the anode voltage level input plate 231 and three peripheral electrode plate 232 through four connection lines 233, respectively. The third embodiment can achieve the individual repair to any one of the micro light emitting diodes 25 without influence the normal light emittance of other micro light emitting diodes 25. The fourth embodiment can achieve the individual repair to any one or two of the micro light emitting diodes 25 without influence the normal light emittance of other micro light emitting diodes 25.

It can be understood that the present invention can further comprises other electrode plate alignments or other connection manners. As long as the anode voltage level input plate 231 are electrically connected to at least two electrode plates 232 through the connection lines 233, and each electrode plate 232 is electrically connected to at least other two electrode plates 232 through the connection lines, or electrically connected to at least one other electrode plate 232 and the anode voltage level input plate 231, the objective of the present invention to individually repair the micro light emitting diode 25 can be achieved, and the achievement of the present invention will not be affected.

Specifically, the present invention divides the anode into a plurality of electrode plates which are spaced with one another, and the respective electrode plates are electrically connected and integrated through the connection lines. The individual repair to any one of the micro light emitting diodes 25 can be achieved without influence the normal light emittance of other micro light emitting diodes 25. Meanwhile, the area which should be implemented with laser cut can be clearly found out for convenience of the repair positioning to ensure the repair result.

In conclusion, in the micro light emitting diode display panel provided by the present invention, the anode of the micro light emitting diode display panel is divided into a plurality of electrode plates which are spaced with one another. The respective electrode plates are electrically connected and integrated through the connection lines. Each electrode plate is correspondingly arranged with one micro light emitting diode. When one of the micro light emitting diodes is defective, the connection line electrically connected to electrode plate of the micro light emitting diode is cut to individually repair the defective micro light emitting diode to be a dark spot, and other micro light emitting diodes can normally emit light. The present invention can simplify a repair process of the micro light emitting diode display panel to promote the success rate of the repair of the micro light emitting diode display panel and to ensure the repair result of the micro light emitting diode display panel. The repair method of the micro light emitting diode display panel provided by the present invention can simplify a repair process of the micro light emitting diode display panel to promote the success rate of the repair of the micro light emitting diode display panel and to ensure the repair result of the micro light emitting diode display panel.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A micro light emitting diode display panel, comprising: a substrate and a plurality of pixel units aligned in array on the substrate;
    each pixel unit comprising: a TFT layer located on the substrate, a planarization layer located on the TFT layer, an anode located on the planarization layer and electrically connected to the TFT layer, a pixel definition layer located at peripheral edges of the anode and on the planarization layer, a cathode insulation layer located on the anode, a plurality of micro light emitting diodes located on the anode and embedded in the cathode insulation layer, and a cathode located on the pixel definition layer, the cathode insulation layer and the plurality of micro light emitting diodes;
    the anode comprising an anode voltage level input plate electrically connected to the TFT layer, a plurality of electrode plates spaced from the anode voltage level input plate and a plurality of connection lines electrically connected to the electrode plates;
    an amount of the micro light emitting diodes and an amount of the electrode plates being the same, and one micro light emitting diode being configured on each electrode plate;
    the anode voltage level input plate being electrically connected to at least two electrode plates through the connection lines, and each electrode plate being electrically connected to at least two other electrode plates through the connection lines, or being electrically connected to at least one other electrode plate and the anode voltage level input plate.

2. The micro light emitting diode display panel according to claim 1, wherein each pixel unit comprises three micro light emitting diodes and three electrode plates, wherein two electrode plates are electrically connected to the other electrode and the anode voltage level input plate through two connection lines, respectively.

3. The micro light emitting diode display panel according to claim 2, wherein the other electrode plate is further electrically connected to the anode voltage level input plate through one connection line.

4. The micro light emitting diode display panel according to claim 1, wherein the TFT layer comprises: a gate located on the substrate, a gate insulation layer located on the gate and the substrate, an active layer located on the gate insulation layer on the gate, an interlayer insulation layer located on the active layer and the gate insulation layer, and a source and a drain being spaced on the interlayer insulation layer and contacting with two ends of the active layer respectively through a first via and a second via penetrating the interlayer insulation layer.

5. The micro light emitting diode display panel according to claim 4, wherein the anode voltage level input plate contacts with the drain through a third via penetrating the planarization layer.

6. A repair method of a micro light emitting diode display panel, comprising steps of:
    step S1, providing a micro light emitting diode display panel, and the micro light emitting diode display panel comprising: a substrate and a plurality of pixel units aligned in array on the substrate;
    each pixel unit comprising: a TFT layer located on the substrate, a planarization layer located on the TFT layer, an anode located on the planarization layer and electrically connected to the TFT layer, a pixel definition layer located at peripheral edges of the anode and on the planarization layer, a cathode insulation layer located on the anode, a plurality of micro light emitting diodes located on the anode and embedded in the cathode insulation layer, and a cathode located on the pixel definition layer, the cathode insulation layer and the plurality of micro light emitting diodes;
    the anode comprising an anode voltage level input plate electrically connected to the TFT layer, a plurality of electrode plates spaced from the anode voltage level input plate and a plurality of connection lines electrically connected to the electrode plates;
    an amount of the micro light emitting diodes and an amount of the electrode plates being the same, and one micro light emitting diode being configured on each electrode plate;
    the anode voltage level input plate being electrically connected to at least two electrode plates through the connection lines, and each electrode plate being electrically connected to at least two other electrode plates through the connection lines, or being electrically connected to at least one other electrode plate and the anode voltage level input plate;
    Step S2, detecting that one of the plurality of micro light emitting diodes is defective, and determining a position of the defective micro light emitting diode;
    step S3, cutting all of the connection lines electrically connected to the electrode plate, in which the micro light emitting diode is defective, and individually repairing the defective micro light emitting diode to be a dark spot.

7. The repair method of the micro light emitting diode display panel according to claim 6, wherein each pixel unit comprises three micro light emitting diodes and three electrode plates, wherein two electrode plates are electrically connected to the other electrode and the anode voltage level input plate through two connection lines, respectively.

8. The repair method of the micro light emitting diode display panel according to claim 7, wherein the other electrode plate is further electrically connected to the anode voltage level input plate through one connection line.

9. The repair method of the micro light emitting diode display panel according to claim 6, wherein the TFT layer comprises: a gate located on the substrate, a gate insulation layer located on the gate and the substrate, an active layer located on the gate insulation layer on the gate, an interlayer insulation layer located on the active layer and the gate insulation layer, and a source and a drain being spaced on the interlayer insulation layer and contacting with two ends of the active layer respectively through a first via and a second via penetrating the interlayer insulation layer.

10. The repair method of the micro light emitting diode display panel according to claim 9, wherein the anode voltage level input plate contacts with the drain through a third via penetrating the planarization layer.

11. A repair method of a micro light emitting diode display panel, comprising steps of:
   step S1, providing a micro light emitting diode display panel, and the micro light emitting diode display panel comprising: a substrate and a plurality of pixel units aligned in array on the substrate;
   each pixel unit comprising: a TFT layer located on the substrate, a planarization layer located on the TFT layer, an anode located on the planarization layer and electrically connected to the TFT layer, a pixel definition layer located at peripheral edges of the anode and on the planarization layer, a cathode insulation layer located on the anode, a plurality of micro light emitting diodes located on the anode and embedded in the cathode insulation layer, and a cathode located on the pixel definition layer, the cathode insulation layer and the plurality of micro light emitting diodes;
   the anode comprising an anode voltage level input plate electrically connected to the TFT layer, a plurality of electrode plates spaced from the anode voltage level input plate and a plurality of connection lines electrically connected to the electrode plates;
   an amount of the micro light emitting diodes and an amount of the electrode plates being the same, and one micro light emitting diode being configured on each electrode plate;
   the anode voltage level input plate being electrically connected to at least two electrode plates through the connection lines, and each electrode plate being electrically connected to at least two other electrode plates through the connection lines, or being electrically connected to at least one other electrode plate and the anode voltage level input plate;
   Step S2, detecting that one of the plurality of micro light emitting diodes is defective, and determining a position of the defective micro light emitting diode;
   step S3, cutting all of the connection lines electrically connected to the electrode plate, in which the micro light emitting diode is defective, and individually repairing the defective micro light emitting diode to be a dark spot;
   wherein each pixel unit comprises three micro light emitting diodes and three electrode plates, wherein two electrode plates are electrically connected to the other electrode and the anode voltage level input plate through two connection lines, respectively;
   wherein the TFT layer comprises: a gate located on the substrate, a gate insulation layer located on the gate and the substrate, an active layer located on the gate insulation layer on the gate, an interlayer insulation layer located on the active layer and the gate insulation layer, and a source and a drain being spaced on the interlayer insulation layer and contacting with two ends of the active layer respectively through a first via and a second via penetrating the interlayer insulation layer.

12. The repair method of the micro light emitting diode display panel according to claim 11, wherein the other electrode plate is further electrically connected to the anode voltage level input plate through one connection line.

13. The repair method of the micro light emitting diode display panel according to claim 11, wherein the anode voltage level input plate contacts with the drain through a third via penetrating the planarization layer.

* * * * *